(12) United States Patent
Marks et al.

(10) Patent No.: US 7,169,989 B2
(45) Date of Patent: Jan. 30, 2007

(54) PROCESS FOR CREATING A 3-DIMENSIONAL CONFIGURATION ON A SUBSTRATE

(75) Inventors: Robert Steven Marks, Omer (IL); Levi Gheber, Beer-Sheva (IL); Rodica Ionescu, Beer-Sheva (IL)

(73) Assignee: Ben Gurion University of the Negev, Research and Development Authority (IL)

( * ) Notice: Subject to any disclaimer, the term of this patent is extended or adjusted under 35 U.S.C. 154(b) by 0 days.

(21) Appl. No.: 10/978,877

(22) Filed: Nov. 1, 2004

(65) Prior Publication Data

US 2005/0118673 A1   Jun. 2, 2005

(30) Foreign Application Priority Data

Dec. 2, 2003  (IL)  ...................................... 159155

(51) Int. Cl.
  *B82B 3/00*   (2006.01)
  *C12P 21/06*  (2006.01)
  *C12P 7/62*   (2006.01)

(52) U.S. Cl. ...................... 977/898; 435/68.1; 435/135

(58) Field of Classification Search ............... 435/68.1, 435/135; 977/849, 856, 888, 895, 989
See application file for complete search history.

(56) References Cited

U.S. PATENT DOCUMENTS 6,676,675 B2 *  1/2004  Mallapragada et al. ...... 606/152
2002/0122873 A1 *  9/2002  Mirkin et al. ................. 427/2.1

OTHER PUBLICATIONS

Takeda S. et al. "Lithographing of biomolecules on a substrate surface using an enzyme-immobilized AFM tip". Nano Letters Nov. 2003, 3(11): 1471-1474. Published on the web Oct. 1, 2003; see attached document.*

Lewis A. et al. "Fountain pen nanochemistry: Atomic force control of chrome etching". Applied Physics Letters, 1999, 75(17): 2689-2691. entire document.*

Kriwacki R & Siuzdak G, "Combined use of proteases and mass spectrometry in structural biology" J. Biomolecular Techniques, 1998, 9: 5-15. (attaced as a web publication, pp. 1-15; see pages 1-4, in particular).*

Braun, E., et al. "DNA-Templated Assembly and Electrode Attachment of a Conducting Silver Wire", *Nature*, 1998, 391, 775-778.

Bruckbauer, A. et al., "Writing with DNA and Protein Using a Nanopipet for Controlled Delivery", *J. Am Chem. Soc.*, 2002, 124, 8810-8811.

Demers, L.M. et al., "Direct Patterning of Modified Oligonucleotides on Metals and Insulators by Dip-Pen Nanolithography", *Science*, 2002, 296, 1836-1838.

Hong, M.H. et al., Scanning Nanolithography Using a Material-Filled Nanopipette, *Appl. Phys. Lett.*, 2000, 77, 2604-2606.

Lee, K. B. et al., "Protein Nanoarrays Generated by Dip-Pen Nanolithography", *Science*, 2002, 295, 1702-1705.

Li, Y. et al., "Electrochemical AFM "Dip-Pen" Nanolithography", *J. Am. Chem. Soc.*, 2001, 123, 2105-2106.

Liu, G.Y. et al., "Positioning Protein Molecules on Surfaces: A Nanoengineering Approach to Supramolecular Chemistry" *Proc. Natl. Acad. Sci. U.S.A.* 2002, 99(8), 5165-5170.

Philipona, C. et al., "A Scanning Near-Field Optical Microscope Approach to Biomolecule Patterning", *Bioconjugate Chem.*, 2001, 12, 332-336.

Piner, R.D. et al., "Dip-Pen Nanolithography", *Science*, 1999, 283, 661-663.

Seeman, N.C., "Nucleic Acid Junctions and Lattices", *J. Theor. Biol*, 1982, 99, 237-247.

Surning, Li. et al., "Enzymatic Degradation of Stereocopolymers Derived from L-, DL- and Meso Lactides", *Polymer Degradation and Stability*, 2000, 67, 85-90.

Sumner, C. et al., "Biosensor based on Enzyme-Catalysed Degradation of Thin Polymer Films", *Biosensors & Bioelectronics*, 2001, 16, 709-714.

Sun, S.Q. et al., "Nanoscale Molecular Patterns Fabricated by Using Scanning Near-Field Optical Lithography", *J. Am. Chem. Soc.*, 2002, 124, 2414-2415.

Taha, H. et al., "Protein Printing with an Atomic Force Sensing Nanofountainpen", *Applied Physics Letters*, 2003, 83, 1041-1043.

* cited by examiner

*Primary Examiner*—Sandra E. Saucier
*Assistant Examiner*—Satyendra K. Singh
(74) *Attorney, Agent, or Firm*—Woodcock Washburn LLP

(57) ABSTRACT

The invention provides a process for introducing a three-dimensional configuration of micron to sub-micron size in a polymeric substrate comprising applying a catalyst for the selective removal of sub-unit parts of the polymer to at least one predetermined area of the polymer substrate via a pipette with a nano-sized orifice.

13 Claims, 5 Drawing Sheets

1(a)

1(b)

1(c)

1(d)

PROCESS FOR CREATING A 3-DIMENSIONAL CONFIGURATION ON A SUBSTRATE

The present invention relates to a process for introducing a three-dimensional configuration of micron to sub-micron size in an organic polymeric substrate.

Harnessing biological molecular machinery, to produce nano-scale features and devices, is an exciting avenue, an alternative approach to designing nano-machines de novo, and a scope of nano-biotechnology. Making use of high recognition specificity by various classes of biological molecules—"smart" building blocks, one can create nano-scale structures of high complexity. For example, very interesting applications have been proposed and demonstrated with DMA, showing very specific addressing and self-assembling properties as described e.g. by Seeman, N. C. *J. Theor. Biol.* 1982, 99, 237 and Braun, E.; Eichen, Y.; Sivan, U.; Ben-Yoseph, G. *Nature* 1998, 391, 775.

On another approach, Scanning Probe Microscopy (SPM) techniques have been shown very useful in creating nano-scale patterns of bio-molecules, due to their high spatial precision. Nano fountain pen (NFP) as described by Lewis, A.; Kheifetz, Y.; Shambrodt, E.; Radko, A.; Khatchatryan, E.; Sukenik, C. *Appl. Phys. Lett.* 1999, 75, 2689, capable of delivering minute amounts of liquids to various surfaces, has been used to print nano-scale features of photoresist as described by Hong, M. H.; Kim, K. H.; Bae, J.; Jhe, W. *Appl. Phys. Lett.* 2000, 77, 2604, DMA as described by Bruckbauer, A.; Ying, L. M.; Rothery, A. M.; Zhou, D. J.; Shevchuk, A. I.; Abell, C.; Korchev, Y. E.; Klenerman, D. *J. Am. Chem. Soc.* 2002, 124, 8810, or proteins as described by Taha, H.; Marks, R. S.; Gheber, L. A.; Rousso, I.; Newman, J.; Sukenik, C.; Lewis, A. *Appl. Phys. Lett.* 2003, 83, 1041. Dip pen nanolithography (DPN) as described by Piner, R. D.; Zhu, J.; Xu, F.; Hong, S. H.; Mirkin, C. A. *Science* 1999, 283, 661, in which an Atomic Force Microscope (AFM) probe is dipped in a solution of self assembling molecules and then used to write nanometric patterns, has been used to print proteins as described e.g. by Lee, K. B.; Park, S. J.; Mirkin, C. A.; Smith, J. C.; Mrksich, M. *Science* 2002, 295, 1702 and Liu, G. Y.; Amro, N. A. *Proc. Natl. Acad. Sci. U. S. A*, 2002, 99, 5165, polymers as described by Li, Y.; Maynor, B. W. ; Liu, J. *J. Am. Chem. Soc.* 2001, 123, 2105 or DMA as described by Demers, L. M.; Ginger, D. S.; Park, S. J.; Li, Z.; Chung, S. W.; Mirkin, C. A. *Science* 2002, 296, 1836. Paper regarding protease immobilized AFM tip, S. Takeda, C. Nakamura, C. Miyamoto, N. Nakamura, M. Kageshima, H. Tokumoto, J. Miyake, *NanoLetters,* 3, 11, 1471-1474. Also, light-based techniques as described e.g. by Sun, S. Q.; Chong, K. S. L.; Leggett, G. J. *J. Am. Chem. Soc.* 2002, 124, 2414 and Philipona, C.; Chevolot, Y.; Leonard, D.; Mathieu, H. J.; Sigrist, H.; Marquis-Weible, F. *Bioconjugate Chem.* 2001, 12, 332, using Near-field Scanning Optical Microscopy (NSOM) may be very useful to patterning with biological molecules. Here we combine biological specificity with precise positioning offered by NFP, to realize enzyme-based negative lithography (creation of depressions) at nanometer scales.

Enzymes are a very large class of biological molecules that have not yet been addressed in the context of nanofabrication, although they present a much richer spectrum of very specific interactions than, e.g. DMA. Enzymes are "nano-chemists", able to promote chemical reactions with high specificity, efficiency and yield. Particularly, proteolytic enzymes hydrolyze peptide bonds, thereby cleaving proteins at very specific sites along the amino-acid sequence.

In light of the above there is now provided according to the present invention a process for introducing a three-dimensional configuration of micron to sub-micron size in a polymeric substrate comprising applying a catalyst for the selective removal of sub-unit parts of the polymer to at least one predetermined area of said polymer substrate via a pipette with a nano-sized orifice.

In preferred embodiments of the present invention said 3-dimensional configuration is selected from the group consisting of grooves, wells and channels.

In especially preferred embodiments of the present invention said catalyst is either an enzyme from the group consisting of hydrolases, or lyases or an organic cleavage agent specific to protein or nucleic acids films.

As indicated, the process of the present invention has wide and varied applications and thus in preferred embodiments of the present invention said substrate is selected from the group consisting of proteins, nucleic acids, di(poly) saccharides, lipids, bacterial cell walls, cell-membranes or lipid bi(multi) layers, phages, viruses and cells.

The following is a list of possible enzymes for use in the present invention:

Hydrolases

1) Acting on Ester Bonds.
Carboxylic ester hydrolases.
Thiolester hydrolases.
Phosphoric monoester hydrolases.
Phosphoric diester hydrolases.
Triphosphoric monoester hydrolases.
Sulfuric ester hydrolases.
Diphosphoric monoester hydrolases.
Phosphoric triester hydrolases.
Exodeoxyribonucleases producing 5'-phosphomonoesters.
Exoribonucleases producing 5'-phosphomonoesters.
Exoribonucleases producing 3'-phosphomonoesters.
Exonucleases active with either ribo- or deoxyribonucleic acid and producing 5'-phosphomonoesters.
Exonucleases active with either ribo- or deoxyribonucleic acid and producing 3'-phosphomonoesters.
Endodeoxyribonucleases producing 5'-phosphomonoesters.
Endodeoxyribonucleases producing other than 5'-phosphomonoesters.
Site-specific endodeoxyribonucleases specific for altered bases.
Endoribonucleases producing 5'-phosphomonoesters.
Endoribonucleases producing other than 5'-phosphomonoesters.
Endoribonucleases active with either ribo- or deoxyribonucleic acid and producing 5'-phosphomonoesters.
Endoribonucleases active with either ribo- or deoxyribonucleic acid and producing 3'-phosphomonoesters.

2) Glycosylases.
Hydrolyse 0-glycosyl bonds
Hydrolyse S-glycosyl bonds
Hydrolyse N-glycosyl bonds 3) Acting on Ether Bonds.
Trialkylsulfonium hydrolases. Ether hydrolases.

4) Acting on Peptide Bonds (Peptide Hydrolases).
Aminopeptidases.
Dipeptidases.
Dipeptidyl-peptidases and tripeptidyl-peptidases.

Peptidyl-dipeptidases.
Serine-type carboxypeptidases.
Metallocarboxypeptidases.
Cysteine-type carboxypeptidases.
Omega peptidases.
Serine endopeptidases.
Cysteine endopeptidases.
Aspartic endopeptidases.
Metalloendopeptidases.
Threonine endopeptidases.

5) Acting on Carbon-Nitrogen Bonds, Other than Peptide Bonds.
In linear amides. In cyclic amides. In linear amidines. In cyclic amidines. In nitriles.

6) Acting on Acid Anhydrides.
In phosphorous-containing anhydrides.
In sulfonyl-containing anhydrides.
Catalyzing transmembrane movement of substances.
Involved in cellular and subcellular movement.

7) Acting on Carbon-Carbon Bonds.
In ketonic substances.

8) Acting on Halide Bonds.
In C-halide compounds.

9) Acting on Phosphorus-Nitrogen Bonds.
Phosphoamidases

10) Acting on Sulfur-Nitrogen Bonds.

11) Acting on Carbon-Phosphorus Bonds.

12) Acting on Sulfur-Sulfur Bonds.

13) Acting on Carbon-Sulfur Bonds.

Lyases

1) Carbon-Carbon Lyases.
Carboxy-lyases.
Aldehyde-lyases.
Oxo-acid-lyases.

2) Carbon-Oxygen Lyases.
Hydro-lyases.
Acting on polysaccharides.
Acting on phosphates.

3) Carbon-Nitrogen Nyases.
Ammonia-lyases.
Lyases acting on amides, amidines, etc.
Amine-lyases.

4) Carbon-Sulfur Lyases

5) Carbon-Halide Lyases.

6) Phosphorus-Oxygen Lyases.

When working with a protein film substrate, preferred cleavage agents are selected from the group consisting of formic acid-cleaves aspartat (Asp), CNBr which cleaves at methionine (Met), hydroxylamine ($NH_2OH$) which cleaves at asparagines (Asn), lodosobenzoic acid which cleaves at tryptophan (Trp), NTCB+Ni (2-nitro-5-thiocyanobenzoic acid) which cleaves at cystein (Cys) and DTT (dithitriethol) which cleaves disulfide (S—S) bonds.

When working with a nucleic acid film substrate, preferred cleavage agents are selected form the group consisting of metal ions and their complexes, diamine and oligoamine, polypeptides containing basic amino acid residues, EDTA-$Fe^{+2}/H_2C>2$, 1,10-phenanthroline-copper (Cu(phen)$_2^+$), oxoruthenium (IV) and octahedral oxopolypyridylruthenium (IV) complexes.

The process of the present invention has many applications including
1. (Nano)array of channels or wells
2. Nano-fluidics in clinical dignostics
3. Functional or Affinity -modified organic channels or wells
4. Capillary electrophoresis with clinical potential of nanobiochip
5. On-chip enzymatic assays
6. Immunoassay in channels or wells
7. Polymer for nano-fluidics
8. Enzymatic or organic digestion in self-assembled substrates
9. Multi-protein biochip for multi-enzymatic digestion
10. Sub-microarrays of bio-recognition locations (including sensors)
11. Nanovolume storage
12. (Nano)dispenser As indicated hereinbefore synthetic substrates can be used with enzymes that effect enzymatic digestion and such substrates and appropriate enzymes are set forth in Table 1 hereinafter.

TABLE 1

Synthetic Substrates and Enzymes Therefor

| Synthetic Substrates | Enzymes |
| --- | --- |
| Poly(esteramide)[1] | A-Chemotrypsin |
| Dextran hydrogels[1] | Dextranase |
| Poly(trimethylene) succinate[1] | Lipase |
| Poly(lactic acid)[2] | Proteinase K |

Superscripts 1 and 2 as set forth in the above Table refer to the following two articles in which said substrates are described:
[1]Claire Sumner, Steffi Krause, Andrea Sabot, Katrina Turner, Calum J. McNeil, Biosensor based on enzyme-catalysed degradation of thin polymer films, Biosensors&Bioelectrmnics, 16, 709–714, (2001).
[2]Suming Li, Mathieu Tenon, Henri Garreau, Christian Braud, Michel Vert, Enzymatic degradation of stereocopolymers derived from L-, DL-, and meso-lactides, Polymer Degradation and Stability, 67, 85–90, (2000).

Furthermore the use of synthetic substrates allows for modulating the sites of cleavage by utilizing enzymes which are specific to specific amino acids found at predesignated cleavage sites wherein such enzymes and the amino acids that can be cleaved catalytically by said enzymes are set forth in Table 2.

TABLE 2

Amino Acid Cleavage Sites and Enzymes Therefor

| Enzymes | Cleavage Sites |
| --- | --- |
| Trypsin | Arginine, Lysine |
| Chymotrypsin | Tyrosine, phenylalanine, tryptophan, methionine, leucine |
| Pepsin | Phenylalanine, tryptophan, tyrosine |
| Elastase | Glycine, Alanine, Serine, Cysteine |

It is further to be realized that utilizing the process of the present invention it is possible, after cleavage, to add a further enzyme to bind a new molecule to the cleaved area.

Furthermore, an enzyme can be pre-inhibited with an inhibitor modified with a "pulling group" such as biotin, after its deposition on a surface, whereby initially no cleavage occurs and thereafter a component such as avidin is added to remove the biotin-linked inhibitor from the active site of the enzyme which can then be active to breakdown the underlying organic substrate.

The invention will now be described in connection with certain preferred embodiments with reference to the following illustrative figures so that it may be more fully understood.

With specific reference now to the figures in detail, it is stressed that the particulars shown are by way of example and for purposes of illustrative discussion of the preferred embodiments of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Figure 1:
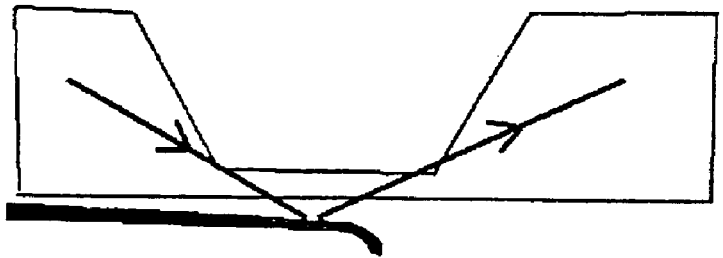
FIG. 1(a) is a schematic side view of a scanning probe microscopy head holding a nano-pipette.
FIG. 1(b) is an SEM image of a cantilevered nano-pipette.
FIG. 1(c) is a close-up of the tapered end of an aperture of the nano-pipette.
FIG. 1(d) is a cross-sectional view of the pipette dispensing liquid due to capillary forces.
Figure 1:
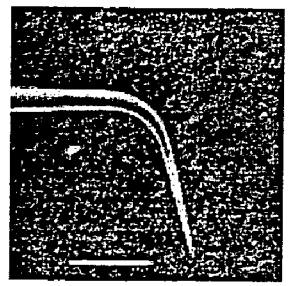
Figure 1:
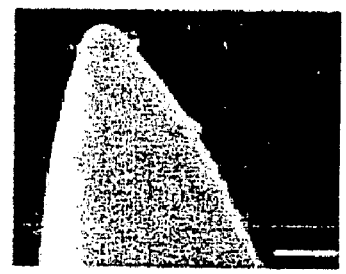
Figure 1:
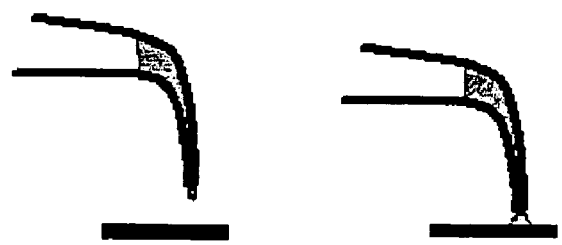

Referring more specifically now to the drawings in detail:

FIG. 1. Nano-Fountain Pen (NFP) setup, (a) SPM scanning head, holding the nano-pipette as its probe and controlling it using standard AFM methods, (b) SEM image of a cantilevered nano-pipette. Scale bar: 100 jam. (c) Close-up of the tapered end of a 50 nm aperture nano-pipette. Scale bar: 500 nm. (d) When the pipette is filled with liquid, it runs to the tapered tip due to capillary forces, but does not flow out due to surface tension (left panel). However, upon contacting the surface, the liquid flows out to the substrate (right panel).

Figure 2:
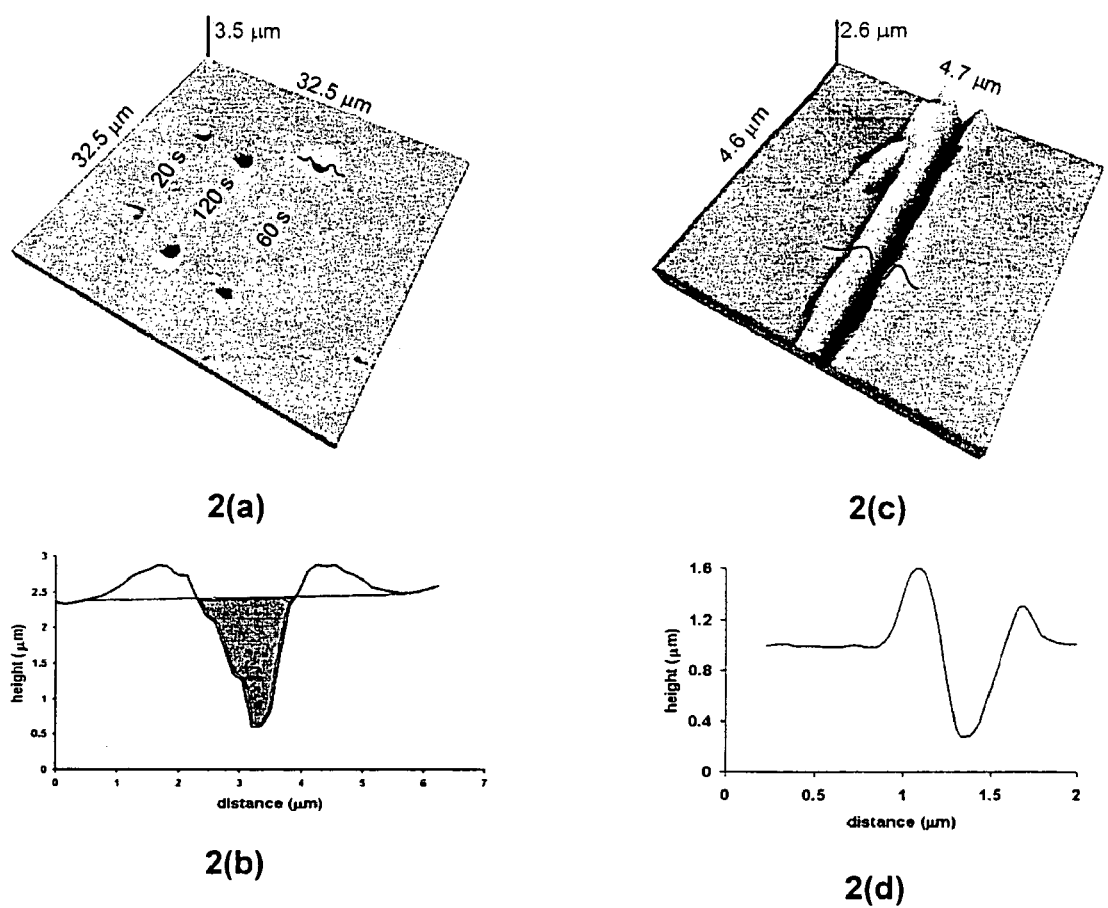
FIG. 2(a) is a perspective view of a surface with wells of different dimensions produced according to the present invention.
FIG. 2(b) is a cross-sectional view of one of the wells of the surface of FIG. 2(a)
FIG. 2(c) is a perspective view of a surface with a channel created according to the present invention.
FIG. 2(d) is a cross-sectional view along the line seen in FIG. 2(c)

FIG. 2. AFM images of features created by flowing trypsin to the BSA substrate, (a) Wells of various dimensions, created by flowing trypsin solution through a 200 nm pipette for different time durations (20 s, 60 s, 120 s, as indicated in the figure), have widths of 0.6 urn, 1.2 urn and 2.3 urn and depths of 0.9 urn, 1.9 urn and 2.4 urn respectively, (b) Cross-section of a 60 s well in (a), along the line indicated. Shaded area indicates the volume of the well that was considered for calculation, (c) Channel created by flowing trypsin solution through a 50 nm pipette, (d) Cross section of the channel in (c), along the line indicated, shows a width of −340 nm and a depth of −660 nm.

Figure 3:
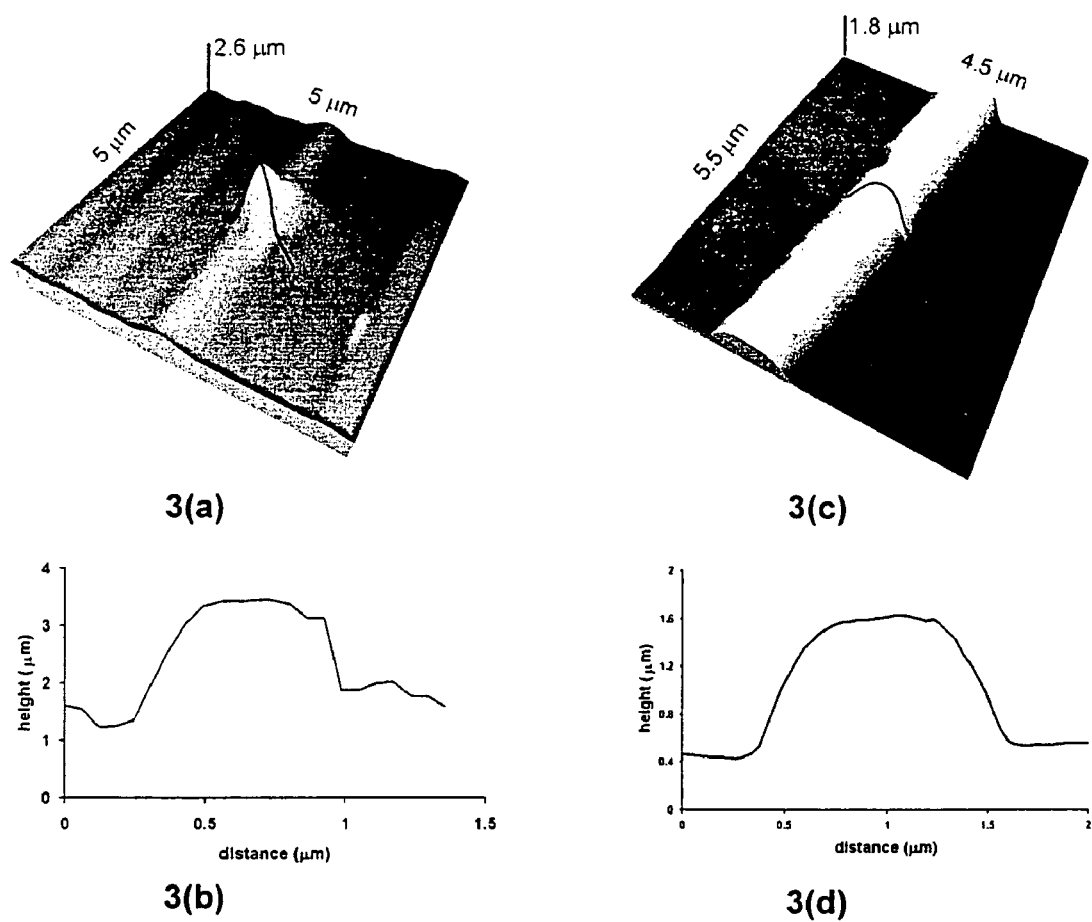
FIG. 3(a) is a perspective view of a surface with a mound produced using water for comparative purposes.
FIG. 3(b) is a cross-sectional view of the mound of the surface of FIG. 3(a)
FIG. 3(c) is a perspective view of a ridge created using water for comparative purposes.
FIG. 3(d) is a cross-sectional view along line of FIG. 3(c)

FIG. 3. AFM images of features created by flowing pure water to the BSA substrate, (a) Mound created by flowing water through a 200 nm pipette for two minutes, (b) Cross section of the mound in (a) along the line indicated, shows a width of 0.75 urn and a height of 2.3 urn. (c) Ridge created by flowing water through 200 nm pipette, (d) Cross section of the ridge in (c) along the line indicated, shows a width of 1.27 um and a height of 1 urn.

Figure 4:
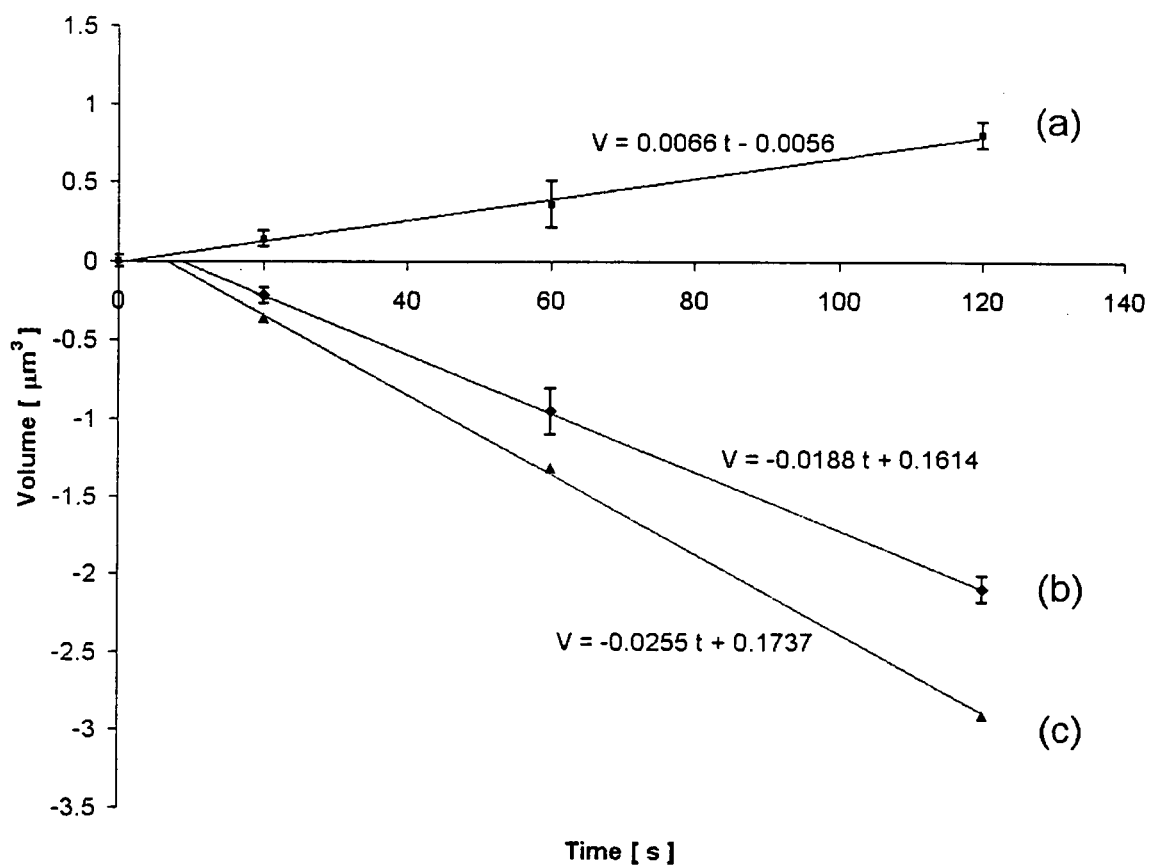
FIG. 4 is a graphical representation of the volume of features formed as a function of time.

FIG. 4. Graphical representation of the volume of features formed as a function of time, (a) Volumes of mounds, calculated from data as shown in FIGS. 3(a),(b), are linear with time of water flow. Linear regression yields a swelling rate of −0.007 [am$^3$/s. Intercept is zero, within experimental error. Error bars indicate variation of 4 different mounds for each time point. Time point for which V=0 is −8.6 s. (b) Volumes of wells, calculated from data as shown in FIGS. 2(a), (b) are linear with the time of trypsin flow. Linear regression yields an etching rate of −0.019 (j,m$^3$/s. Intercept predicts a protrusion of −0.16 |im$^3$ at t=0. Error bars indicate the variation of 3 different wells for each time point, (c) Deduced trypsin etching is calculated as the difference between the combined effect (b) and swelling (c). Linear regression yields an etching rate of −0.026 (^m$^3$/s. Time point for which V=0 is −6.8 s.

Figure 5:
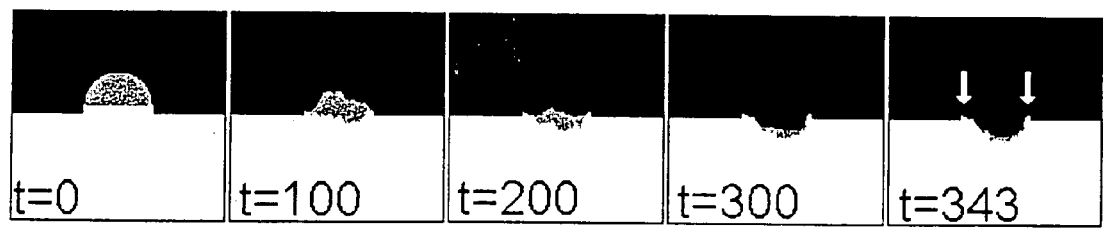
FIG. 5 is a presentation of five time lapse snapshots showing various stages of etching in time according to the present invention.

FIG. 5. A series of images reproduced from a Monte-Carlo simulation. The white portion represents the BSA substrate, dark grey represents the water drop, light grey dots within the drop represent trypsin molecules, and the black background represents air. The time-lapse snapshots show the various stages of trypsin etching of a BSA sample that has initially swollen. The times indicated are the iteration step of the simulation. Note the "shoulders" (indicated by arrows) that remain un-etched on both sides of the resulting groove.

EXAMPLE A

A Procedure for Use in the Present Invention

Trypsin, a proteolytic enzyme that cleaves on the carboxyl side of lysine and arginine residues were used to break locally a layer of Bovine Serum Albumin (BSA) protein macromolecules. BSA is a 607 amino acid protein, which contains 60 lysines and 26 arginines with the longest peptide between two adjacent cleavage sites of 20 amino acids in length; thus, a major collapse of the three dimensional structure of BSA is expected after cleavage. Substrates were prepared by dissolving O.SmM BSA (Sigma) in ultrapure Millipore water and applying 35 ul drops onto 95% ethanol flamed glass cover slips, then allowed to dry for 7 days at room temperature. Bovine trypsin, treated with L-(tosylamido-2-phenyl ethyl) chloromethyl ketone, to inhibit chemotryptic activity (TPCK-trypsin, bovine pancreas, Pierce), in an amount of 1.3 mg, was diluted in 1 ml of 0.05M sodium borate, pH=8.5 (BupH ™ Borate buffer, Pierce) and subsequently loaded in the nano-pipettes (Nanonics Ltd., Jerusalem, Israel). Trypsin was flown through a cantilevered nano-pipette to the BSA film surface, and allowed to engrave features. The process was controlled with nanometer precision by employing a SPM flat scanner, (FIG. 1(a)) ("NSOM/AFM 100"—Nanonics Ltd., Jerusalem, Israel), to hold the nano-pipette (FIGS. 1 (b), (c)) and position the sample in a "Nano Fountain Pen" (NFP) fashion (Lewis, A. et al. ibid., Hong, M. H. et al. ibid., Bruchbauer A., et al. ibid., and Taha, H., et. Al. ibid) (FIG. 1(d)). Subsequently, the same instrument was used to image the features with standard Atomic Force Microscope (AFM) probes (MikroMasch, Tallinn, Estonia).

EXAMPLES OF NANO-ENGRAVING PROTEIN SURFACES

Example 1

Round wells, with increasing diameters and depths, resulted from keeping the nano-pipette in contact with the BSA substrate for increasing periods of time.

In FIG. 2(a) there is seen an AFM image showing three pairs of wells created in this way. A cross section through one of the wells is shown in FIG. 2(b). The volumes of the depressions below the surface of the sample (as shown in the shaded area in FIG. 2(b)) were calculated, and appear to depend roughly linearly with the time of trypsin flow, as shown in FIG. 4(b). The negative values of the volumes indicate a depression. These experiments were repeated with nano-pipettes having different aperture diameters, with similar results.

Example 2

Channels were created by moving the sample while the pipette was in contact. Their dimensions were found to depend on the diameter of the pipette aperture and on the sample velocity. Faster lateral movement and smaller aperture resulted in smaller width and depth of channels. One such channel is presented in FIG. 2(c), with a width of ~340 nm and a depth of ~660 nm, which channel was created according to the present invention with a 50 nm aperture pipette, at a velocity of ~3 f rn/s.

There are two surprising features in these experiments. One is the existence of "shoulders", protrusions above the background surface, around the wells and on both sides of the channels (FIGS. 2(b) and 2(d)). The other is the fact that the line describing the dependence of the etched volume with time has a positive intercept at zero time (FIG. 4 (b)). In other words, there is a protrusion (−0.16 ^im$^3$) at t=0. In fact, both effects have a common reason, namely swelling of the protein substrate, as shown below.

Comparetive Example 3

Control experiments were performed with water filled pipettes. These resulted in mounds, when the sample was held in the same position (as opposed to wells when trypsin was present in the solution), or ridges, when the sample was moved (as opposed to channels in the trypsin case). A mound created this way is shown in FIG. 3(a), where water was flown for a period of 120 s. A ridge created with water only is shown in FIG. 3(c). These protrusions are a result of swelling of the BSA film. In fact, this swelling is what allows trypsin to access the cleavage sites of the individual BSA molecules. Flowing water for increasing time durations, results in taller and wider mounds, with volumes increasing roughly linearly with time (FIG. 4 (b)).

Thus comparing the results of Examples 1 and 2 with the results of Example 3, one can see that indeed it is possible according to the present invention to effect the selective removal of sub-unit parts of a polymeric substrate utilizing the appropriate catalyst and this effect is diametrically opposite to that achieved when applying water, which merely results in a change of configuration as a result of swelling.

Example 4

As a final demonstration of the combined effect described herein, a solution of soybean trypsin inhibitor: trypsin in a ratio of 10:1 was used. Again, the resulting features are positive volume mounds and ridges. Trypsin activity is inhibited, therefore the only effect is swelling. One can, in principle, use the inhibitor concentration as a tool to modulate trypsin activity. The existence of a specific inhibitor is obviously an additional benefit from using enzymes as etchants. This is a double specific recognition system, wherein the enzyme recognizes its substrate and the inhibitor recognizes its enzyme.

Proposed Enzymatic Mechanism

With these facts in mind, a comprehensive mechanism for the creation of the structures is postulated. Upon contact of the pipette with the sample, the trypsin solution wets the BSA substrate. The water causes an initial swelling of the BSA layer, thereby exposing lysine and arginine residues to the active trypsin sites, and allows further penetration of the trypsin solution into the BSA film. Upon cleavage into short oligo-peptides, the three dimensional structure of BSA collapses and a void is created. The process of etching is stopped by evaporation of the solution and drying of the trypsin, which then becomes inactive. The creation of depressions is the result of two competing effects, i.e. swelling (increasing positive volume) caused by the aqueous solution and etching (increasing negative volume) by the enzyme. Obviously, in the case presented, the rate of etching is higher than the rate of swelling, resulting in a net etching. The volumes of the wells, described in FIG. 4 (b) are the result of this combined effect. Therefore, from the data about the swelling rate and the combined effect (FIGS. 4, (a) and (b), respectively), one can deduce the etching rate of trypsin. The difference between the combined effect (FIG. 4(b)) and the swelling (FIG. 4(a)) is plotted in FIG. 4(c). From the slopes and intercepts of the linear regression lines fitted to the data points, it is visible that the swelling starts at t=0, at a rate of ~0.0066 |im$^3$/s, trypsin activity starts some 6.5 seconds later at a rate of −0.026 ^im$^3$/s. The resulting, combined effect is a growing depression, which extends below the original (un-swollen) surface of the sample some 8.5 seconds from the initial pipette contact (some 2 seconds after trypsin starts cleaving the BSA), at a rate of ~0.19 jam$^3$/s. This is obviously a simplified model, however, it retains most of the important parameters of the process. An implication from this information is that varying the enzyme concentration will help modulate various etching rates.

Proposed Monte-Carlo Simulation

A Monte-Carlo simulation starts with a drop of trypsin solution on top of a rectangular mound of BSA (representing the initial swelling of BSA). The algorithm simulates free diffusion of trypsin within the water drop, evaporation of water molecules from the surface of the drop and collapse of BSA that is being met by a trypsin molecule. Not only does the simulation predict a roughly linear dependence of the etched volume with time, but it also provides the explanation for the "shoulders" observed in the AFM images. Due to the fact that the water molecules evaporate from the surface of the drop, its diameter decreases. Trypsin is forced towards the center of the hemisphere, thus increasing its concentration. This causes a preferential etching in areas below the center of the drop; thus, areas initially below the edges of the drop remain relatively untouched. These are the "shoulders"

that are observed in the figures. A sequence of images reproduced from the computer simulation is presented in FIG. 5.

Remarks

An interesting conclusion resulting from this simplistic model is that the net effect of trypsin activity and swelling needs not always be a depression. If the trypsin etching rate is slower than the swelling rate, then no depressions are expected. Indeed, when reducing the trypsin concentration to half, the resulting features are mounds and ridges.

The above examples demonstrate, for the first time, the use of a proteolytic enzyme to etch nanometer-scale depressions in a protein surface. The process of the present invention has a great potential to create complex, three-dimensional features, by wisely choosing enzymes and substrates with predesigned cleavage sites. By taking advantage of the wide spectrum of specific enzyme-substrate interactions, one can envision possible applications such as nano-fluidics with readily functional organic or bio-organic channels and wells, creation of masks for further processing of the underlying substrate (whether biological or other), and others, with unprecedented nanometric resolution.

It will be evident to those skilled in the art that the invention is not limited to the details of the foregoing illustrative embodiments and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A process for introducing a three-dimensional configuration of micron to sub-micron size in a polymeric substrate comprising applying an enzyme for the selective removal of sub-unit parts of the polymer to at least one predetermined area of said polymeric substrate via a pipette with a nano-sized orifice.

2. The process according to claim 1 wherein said three-dimensional configuration is selected from the group consisting of grooves, wells and channels.

3. The process according to claim 1 wherein said enzyme is selected from the group consisting of hydrolases and lyases.

4. The process according to claim 1 wherein said substrate is selected from the group consisting of proteins, nucleic acids, polysaccharides, lipids, bacterial cell walls and virus or phages.

5. The process according to claim 1 wherein said substrate is selected from the group consisting of a polyesteramide, a dextran hydrogel, a polytrimethylene succinate and a polylactic acid.

6. The process according to claim 5 wherein said substrate is a polyesteramide and said enzyme is α-chymotrypsin.

7. The process according to claim 5 wherein said substrate is a dextran hydrogel and said enzyme is dextranase.

8. The process according to claim 5 wherein said substrate is a polytrimethylene succinate and said enzyme is lipase.

9. The process according to claim 5 wherein said substrate is a polylactic acid and said enzyme is proteinase K.

10. The process according to claim 1 wherein said at least one predetermined area comprises a cleavage site containing an amino acid selected from the group consisting of arginine and lysine and said enzyme is trypsin.

11. The process according to claim 1 wherein said at least one predetermined area comprises a cleavage site containing an amino acid selected from the group consisting of tyrosine, phenylalanine, tryptophan, methionine and leucine and said enzyme is chymotrypsin.

12. The process according to claim 1 wherein said at least one predetermined area comprises a cleavage site containing an amino acid selected from the group consisting of phenylalanine, tryptophan and tyrosine and said enzyme is pepsin.

13. The process according to claim 1 wherein said at least one predetermined area comprises a cleavage site containing an amino acid selected from the group consisting of glycine, alanine, serine and cysteine and said enzyme is elastase.

* * * * *